US010554126B2

(12) United States Patent
Kruiskamp et al.

(10) Patent No.: US 10,554,126 B2
(45) Date of Patent: Feb. 4, 2020

(54) CONTINUOUS COMPARATOR WITH IMPROVED CALIBRATION

(71) Applicants: Dialog Semiconductor GmbH, Kirchheim/Teck-Nabern (DE); Dialog Semiconductor B.V., 's Hertogenbosch (NL)

(72) Inventors: Marinus Wilhelmus Kruiskamp, Den Bosch (NL); Guillaume de Cremoux, Edinburgh (GB)

(73) Assignees: Dialog Semiconductor GmbH, Kirchheim/Teck-Nabern (DE); Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 14/513,326

(22) Filed: Oct. 14, 2014

(65) Prior Publication Data
US 2015/0115920 A1 Apr. 30, 2015

(30) Foreign Application Priority Data

Oct. 31, 2013 (EP) ..................................... 13191228

(51) Int. Cl.
*H02M 3/156* (2006.01)
*H03K 17/94* (2006.01)
(Continued)

(52) U.S. Cl.
CPC ........... *H02M 3/156* (2013.01); *H02M 3/157* (2013.01); *H02M 3/1588* (2013.01);
(Continued)

(58) Field of Classification Search
CPC .... H02M 3/156; H02M 3/158; H02M 3/1588; H02M 3/1584; H02M 3/157; H02M 3/33507; H02M 3/1563; H02M 3/155; H02M 1/4225; Y02B 70/126; Y02B 70/1466
(Continued)

(56) References Cited

U.S. PATENT DOCUMENTS 7,868,595 B1 * 1/2011 Smith ..................... H02M 1/36
323/222
2008/0298106 A1 12/2008 Tateishi
(Continued)

FOREIGN PATENT DOCUMENTS

CN 102377338 3/2012

OTHER PUBLICATIONS

European Search Report 13191228.9-1809 dated Apr. 17, 2014, Dialog Semiconductor GmbH et al.
(Continued)

*Primary Examiner* — Adolf D Berhane
*Assistant Examiner* — Kevin H Sprenger
(74) *Attorney, Agent, or Firm* — Saile Ackerman LLC; Stephen B. Ackerman

(57) ABSTRACT

An auto-calibrated current sensing comparator is provided. A secondary dynamic comparator shares the same inputs and acts to adjust a calibration control of the current sensing comparator. The calibration control may be in the form of adjusting the offset of the current sensing comparator or adjusting a propagation delay that is added to its output.

10 Claims, 8 Drawing Sheets

(51) Int. Cl.
*H02M 3/157* (2006.01)
*H02M 3/158* (2006.01)
*H02M 1/00* (2006.01)

(52) U.S. Cl.
CPC ..... *H03K 17/94* (2013.01); *H02M 2001/0025* (2013.01); *Y02B 70/1466* (2013.01); *Y10T 307/865* (2015.04)

(58) Field of Classification Search
USPC .......................................... 323/222, 282–288
See application file for complete search history.

(56) References Cited

U.S. PATENT DOCUMENTS

| | | | |
|---|---|---|---|
| 2010/0194370 A1 | 8/2010 | Cheng | |
| 2011/0018516 A1* | 1/2011 | Notman | H02M 3/1588 323/284 |
| 2012/0235653 A1 | 9/2012 | Chen et al. | |
| 2014/0277812 A1* | 9/2014 | Shih | G05F 1/563 700/298 |
| 2014/0340122 A1* | 11/2014 | Savanth | G01R 19/0084 327/50 |
| 2015/0069989 A1* | 3/2015 | Yau | H02M 3/156 323/282 |

OTHER PUBLICATIONS

European Office Action, Application No./Patent No. 13191228.9-1201 / 2869447, Applicant: Dialog Semiconductor GmbH, et al., dated Nov. 30, 2018, 10 pages.

European Office Action, Application No. 13 191 228.9-1809, Applicant: Dialog Semiconductor GmbH, et al., dated Jan. 5, 2017, 6 pages.

European Office Action, Application No. 13 191 228.9-1201, Applicant: Dialog Semiconductor GmbH, et al., dated Jun. 21, 2018, 7 pages.

CMOS Analog Integrated Circuits: High-Speed and Power-Efficient Design, Chapter 6: Nonlinear Analog Components, Copyright 2011, Chapman and Hall/CRC, pp. 225-241.

EPO Communication, Application No. 13091228.9-1201 / 2869447, Applicant: Dialog Semiconductor GmbH, et al., dated Apr. 3, 2019, pp. 1-11.

\* cited by examiner

CONTINUOUS COMPARATOR WITH IMPROVED CALIBRATION

TECHNICAL FIELD

The present disclosure relates to a continuous comparator with improved calibration, and in particular to circuits, methods for calibration of a continuous comparator, and a switched mode power supply comprising a continuous comparator with improved calibration.

BACKGROUND

Current sensing comparators are widely used in buck and boost converters. Their function is to detect that current has exceeded a maximum current limit or that the current has changed polarity.

However a current sensing comparator will have an inherent offset and delay that mean the comparator will tend not to change state at the correct moment. These offsets and delays can be compensated for by adding a fixed offset to the comparator threshold level. However, even this compensation is not ideal, because the ideal value of the comparator offset is affected by random process mismatch, inductor value and input or output voltage variation. Therefore a fixed comparator offset will not be able to track the ideal value.

This problem is exacerbated by industry trends for ever smaller inductor values which mean that inductor current fluctuates at greater frequencies.

It is therefore desired to improve the calibration of continuous comparators.

SUMMARY

According to a first aspect of the disclosure there is provided a circuit comprising:
 a switch;
 a continuous comparator that monitors a current across the switch;
 a dynamic comparator that shares the same inputs as the continuous comparator;
 a calibration control for the continuous comparator that is coupled with an output of the dynamic comparator; and wherein
 a clock for the dynamic comparator is coupled with a control signal for changing the state of the switch.

A "comparator" in the present disclosure is a comparator circuit that is designed to compare the voltage or current between two inputs. The comparator circuit may include elements such as a fixed or variable offset, or a fixed or variable delay line. This applies equally to continuous comparators and to the clocked comparators described herein.

Optionally, the calibration control is coupled with an output of the dynamic comparator via a counter which operates to increment or decrement the calibration control.

Optionally, the calibration control comprises a variable comparator offset.

Optionally, the calibration control comprises a variable propagation delay that can be added to the comparator output.

Optionally, the continuous comparator is a zero crossing comparator.

Optionally, the continuous comparator is a current limit comparator.

According to a second aspect of the disclosure there is provided a switched mode power supply including a circuit that comprises:
 a switch;
 a continuous comparator that monitors a current across the switch;
 a dynamic comparator that shares the same inputs as the continuous comparator;
 a calibration control for the continuous comparator that is coupled with an output of the dynamic comparator; and wherein
 a clock for the dynamic comparator is coupled with a control signal for changing the state of the switch.

Optionally, the switched mode power supply comprises a buck convertor with a zero crossing comparator and/or a current limit comparator being the continuous comparator(s) of the second aspect.

Optionally, the switched mode power supply comprises a boost convertor with a zero crossing comparator and/or a current limit comparator being the continuous comparator(s) of the second aspect.

Optionally, the switched mode power supply comprises a buck-boost convertor with a zero crossing comparator and/or a current limit comparator being the continuous comparator(s) of the second aspect.

According to a third aspect of the disclosure there is provided a method of operating a switch in a circuit, comprising:
 monitoring a current across the switch with a continuous comparator; and
 calibrating the continuous comparator based on the operation of a dynamic comparator which shares the same inputs as the continuous comparator; wherein
 the dynamic comparator is clocked by a control signal, for changing the state of the switch.

Optionally, the output of the dynamic convertor increments or decrements a counter which in turn adjusts the calibration applied to the continuous comparator.

Optionally, calibrating the continuous comparator comprises varying an offset that is applied to it.

Optionally, the method comprises adding a propagation delay to the output of the continuous comparator and calibrating the continuous comparator comprises varying the delay that is added.

Optionally, the continuous comparator is a zero crossing comparator.

Optionally, the continuous comparator is a current limit comparator.

Optionally, the circuit comprises a switched mode power supply.

Optionally, the switched mode power supply comprises a buck convertor with a zero crossing comparator and/or a current limit comparator being the continuous comparator(s) of the third aspect.

Optionally, the switched mode power supply comprises a boost convertor with a zero crossing comparator and/or a current limit comparator being the continuous comparator(s) of the third aspect.

Optionally, the switched mode power supply comprises a buck-boost convertor with a zero crossing comparator and/or a current limit comparator being the continuous comparator(s) of the third aspect.

According to a fourth aspect of the disclosure there is provided a circuit comprising:
 a switch;
 a continuous comparator that monitors a current across the switch;

a dynamic comparator that shares the same inputs as the continuous comparator;

a calibration control for the continuous comparator that is coupled with an output of the dynamic comparator; and which comprises a variable propagation delay that can be added to the comparator output.

Optionally, the calibration control is coupled with an output of the dynamic comparator via a counter which operates to increment or decrement the calibration control.

According to a fifth aspect of the disclosure there is provided a method of operating a switch in a circuit, comprising:

monitoring a current across the switch with a continuous comparator;

adding a propagation delay to the output of the continuous comparator;

calibrating the continuous comparator based on the operation of a dynamic comparator which shares the same inputs as the continuous comparator; wherein calibrating the continuous comparator comprises varying the delay that is added.

BRIEF DESCRIPTION OF THE DRAWINGS

The disclosure will be described below, by way of example only, with reference to the accompanying drawings, in which.

DESCRIPTION

The disclosure provides for the calibration of a continuous comparator which monitors a current through a switch. The disclosure is not limited to any particular comparator architecture and any comparator arrangement for monitoring a current through a switch, either directly or indirectly, may be provided. In particular, the continuous comparator may comprise a voltage comparator coupled with an impedance element (which could be the ON-resistance of the switch), so that the direct monitoring of the voltage provides the basis for the current monitoring. The calibration of the continuous comparator is achieved by providing a dynamic comparator which shares the same inputs as the continuous comparator and which provides an input for a calibration control.

A "dynamic comparator" may also be generally referred to as a "clocked comparator" or a "latched comparator". Such a comparator is selectively activated with a clock signal so that the dynamic comparator only makes a comparison when the clock signal is high. In contrast, a continuous comparator will output a 1 or a 0 any time that a high or low signal is applied to its input.

In one aspect of the disclosure, the calibration control comprises varying an offset of the continuous comparator. In an alternative aspect, the calibration control comprises varying a propagation delay that is applied to the output of the continuous comparator.

The dynamic comparator may be clocked by coupling its latch with a switching node voltage. Alternatively, the dynamic comparator can be clocked by coupling its latch with a control signal that is applied for operating the switch.

Figure 1:
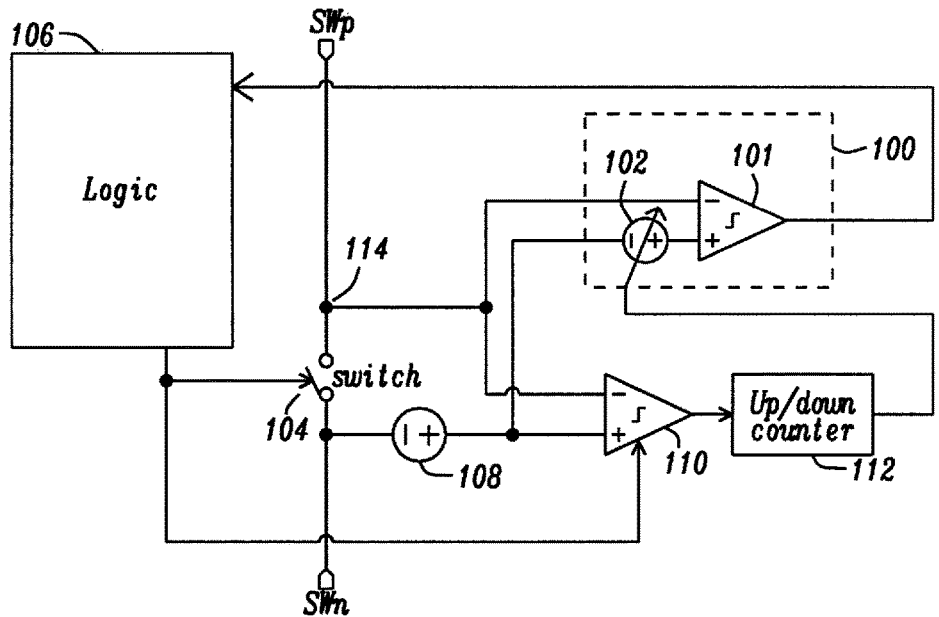
FIG. 1 illustrates a first aspect of the disclosure, wherein a continuous comparator is provided with a calibration control comprising varying an offset of the comparator.

A first aspect of the disclosure, wherein the calibration control comprises varying an offset of the continuous comparator, is shown in FIG. 1. The continuous comparator 100 monitors the current through a switch 104, which is controlled by logic circuitry 106 to selectively connect two nodes, illustrated here as a positive voltage SWp and negative voltage SWn. A reference voltage 108 is also provided, and is set to the voltage at which the switch should open. A variable offset 102 and basic comparator elements 101 together form the continuous comparator 100. The variable offset 102 can be set by a digital control signal.

A dynamic comparator 110 is also provided, which shares the same inputs as the continuous comparator 100. The dynamic comparator provides an input for a calibration control which in this aspect comprises a counter 112 and the variable offset 102 of the comparator 100.

The dynamic comparator can be clocked by coupling its latch with the switching node voltage 114. However it is also possible for the dynamic comparator to be clocked by coupling its latch with the output of the logic circuitry 106, which provides a control signal for operating the switch 104. This is the arrangement that is illustrated in FIG. 1.

A dynamic comparator has a short reaction time from a clock signal, which lets it perform its comparison at a well-defined point in time. It also can hold the result for further use. Therefore the dynamic comparator can be used to check if the voltage over the switch is equal to the intended voltage at the moment of opening the switch. The dynamic comparator should have a low offset itself which can be achieved by construction or by trimming.

The offset of the main comparator 100 is controlled in small discrete steps by the digital output from the UP/DOWN counter 112. The purpose of the automatic calibration is to find the digital value for which the switch 104 is opened at exactly the right moment.

Each time the switch 104 opens, the dynamic comparator 110 generates a signal "up" or "down" for the up/down counter 112. This will increase or decrease the offset of the continuous comparator 100.

After a certain amount of clock periods, the counter value will alternate around the ideal value. The switch 104 then switches very close to the ideal moment.

An additional advantage of continuous calibration (over one-time trimming during production) is that the offset in the main comparator 100 will track any variation and will always make sure that the opening of switch takes place very close to the ideal moment.

Figure 2:
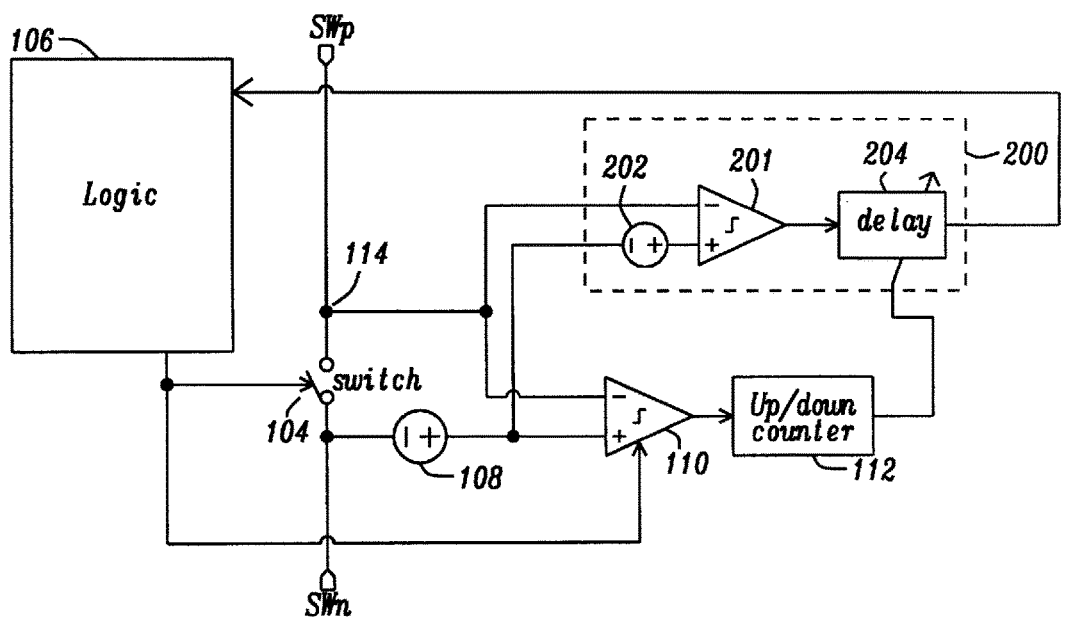
FIG. 2 illustrates a first aspect of the disclosure, wherein a continuous comparator is provided with a calibration control comprising adjusting a propagation delay which is applied to the comparator output.

A second aspect of the disclosure, wherein the calibration control comprises varying a propagation delay that is applied to the output of the continuous comparator, is shown in FIG. 2. Again, a dynamic comparator shares the same inputs as a continuous comparator and which provides an input for a calibration control. An offset 202, basic comparator elements 201 and variable propagation delay 202 together form the continuous comparator 200. The circuit of FIG. 2 shares some common components with the circuit of FIG. 1, and like components are illustrated with like reference numerals.

However, in the aspect illustrated in FIG. 2, the continuous comparator 200 is provided with a fixed offset 202, and a propagation delay applied to the output of the main comparator 200 is controlled in small discrete steps by the digital output from the UP/DOWN counter 112 which provides an input for the delay circuit 204. The variation of the propagation delay means that the main comparator 200 will track any variation and will always make sure that the opening of switch takes place very close to the ideal moment.

The delay circuit may comprise a delay line of any suitable architecture, for example a series of buffers that can be selectively activated via a multiplexer to provide different signal delays as desired, or as an analog delay based on an RC time-constant in which either the C (capacitor) and/or the R (resistor) can be trimmed in discrete steps.

The dynamic comparator can be clocked by coupling its latch with the switching node voltage 114. However it is also possible for the dynamic comparator to be clocked by coupling its latch with the output of the logic circuitry 106, which provides a control signal for operating the switch 104. This is the arrangement that is illustrated in FIG. 2.

Continuous comparators are used for various purposes and as component parts of various other circuits, and the disclosure provides circuitry that comprises continuous comparators calibrated as described. Examples of such circuitry include switched mode power supplies which may include DC-DC converters such as buck converters, boost converters or buck-boost converters.

Figure 3:
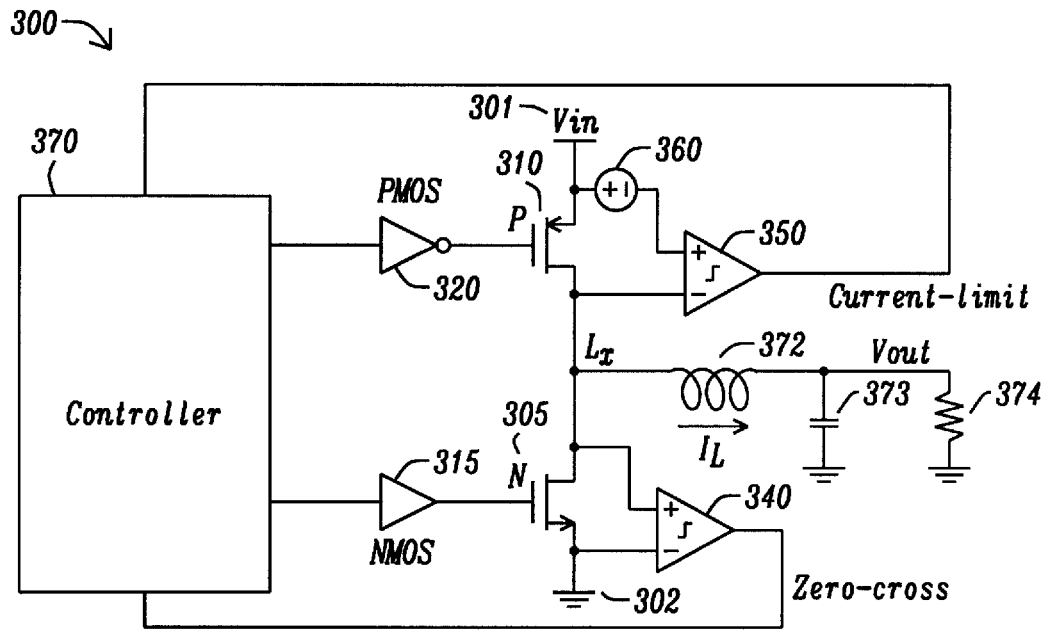
FIG. 3 illustrates a typical buck converter known to the inventor.
Figure 3:
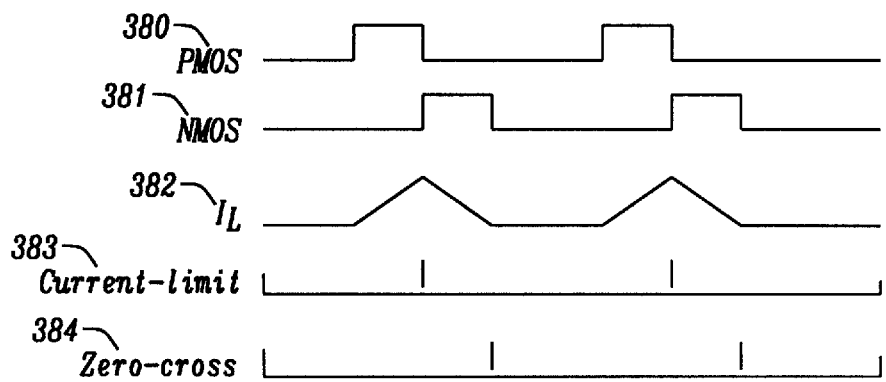

A typical buck converter known to the inventor is shown in FIG. 3, which shows a schematic circuit diagram and a timing diagram showing the state of the PMOS and NMOS power switches and the inductor current (IL) over time, and showing the timings of the ideal current limit and zero crossing comparator switching. It is assumed for the following description of the figure that this buck converter works in discontinuous conduction mode (DCM) meaning that the inductor current will drop to zero Ampere at the end of each cycle.

FIG. 3 illustrates a network between VIN 301, and ground 302. An NMOS transistor 305 pulls down the node Lx. A PMOS transistor 310 pulls up the node Lx. The PMOS transistor 310 gate electrode is connected to PMOS inverter 320, and the NMOS transistor 305 gate electrode is connected to NMOS logic gate 315. In parallel with the NMOS 305 is a comparator 340. In parallel with the PMOS 310 is a comparator 350 provided with fixed offset 360. The comparators 340 and 350 provide feedback signals to controller 370 which provides a current limit. The circuit has an inductor 372, capacitor 373, and resistor 374 connected to the node Lx.

A controller 370 is provided that receives outputs from the zero-cross and current limit comparators and controls pMOS 320 and nMOS 315 transistors via respective inverter and buffer. When the output voltage is too low, the pMOS transistor "P" is turned on ("PMOS"='1'). This will cause the current "$I_L$" in the inductor "L" to rise and current is supplied to the output "VOUT" 371. At a certain moment, the inductor current will cross a maximum-current threshold. This will trigger the comparator and will make the signal "Current limit" high. This is the sign for the controller to open the pMOS transistor "P" and close the nMOS transistor "N" ("PMOS"='0' and "NMOS"='1'). The inductor current will now drop while still flowing to the output "VOUT". At a certain moment the current changes polarity (crosses zero Ampere). This will trigger the zero-crossing comparator ("Zero-cross"='1'). This is the sign for the controller to open the nMOS transistor "N" and to wait for a next cycle with zero current flowing in the inductor and with both power switches "P" and "N" open. A timing diagram of the signals of PMOS 380, NMOS 381, inductor current 382, current limit 383, and zero cross 384 is illustrated.

Figure 4:
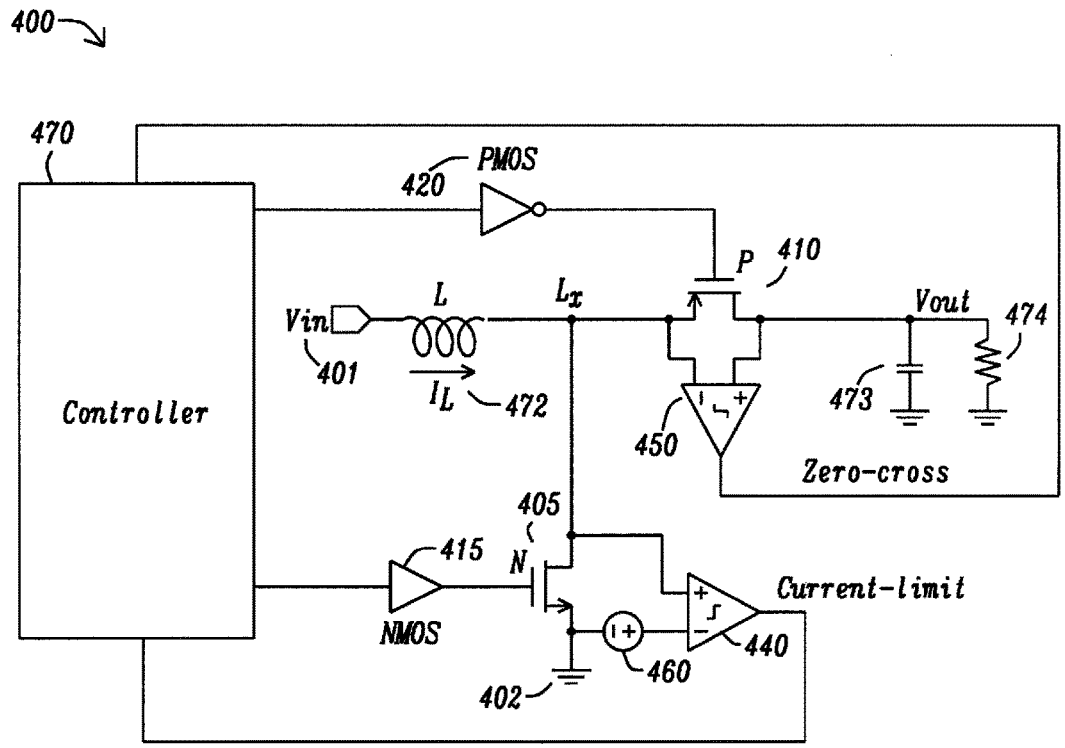
FIG. 4 illustrates a typical boost converter known to the inventor.
Figure 4:
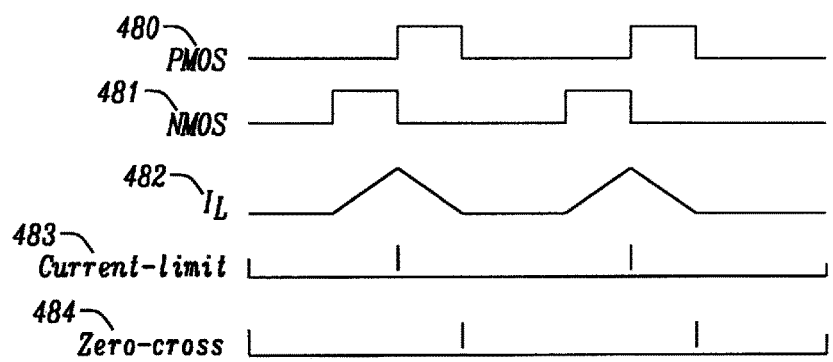

FIG. 4 illustrates a boost converter. FIG. 4 illustrates a network 400 between VIN 401, and ground 402. An NMOS transistor 405 pulls down the node Lx. A PMOS transistor 410 pulls up the node Lx. The PMOS transistor 410 gate electrode is connected to PMOS inverter 420, and the NMOS transistor 405 gate electrode is connected to NMOS logic gate 415. In parallel with the NMOS 405 is a comparator 440 with offset 460. In parallel with the PMOS 410 is a comparator 450. The comparators 440 and 450 provide feedback signals to controller 470. The feedback signal from comparator 450 provides a zero-cross signal; the feedback signal from comparator 440 provides a current-limit signal. The circuit has an inductor 472, capacitor 473, and resistor 474 connected to the node Lx.

A similar kind of operation takes place in a boost converter, an example of which is illustrated in FIG. 4. In an initial state (as shown in the figure) both transistors "N" and "P" are off ("NMOS and "PMOS" are '0') and there is zero current in the inductor ($I_L$=0). When the output voltage is too low, the nMOS transistor "N" is turned on ("NMOS"='1'). This will cause the current "$I_L$" in the inductor "L" 472 to rise and energy is stored in the inductor. At a certain moment, the inductor current will cross a maximum-current threshold. This will trigger the comparator and will make the signal "Current-limit" high. This is the sign for the controller to open the nMOS transistor "N" and close the pMOS transistor "P" ("NMOS"='0', "PMOS"='1'). The inductor current will now flow to the output "VOUT". Due to the negative voltage over the inductor, the inductor current will drop. At a certain moment the current changes polarity (crosses zero Ampere). This will trigger the zero-crossing comparator ("Zero-cross"='1'). This is the sign for the controller to open the PMOS transistor "P" ("PMOS"='0') and to wait for a next cycle. A timing diagram of the signals of PMOS 480, NMOS 481, inductor current 482, current limit 483, and zero cross 484 is illustrated.

For the most efficient and safe behavior of the buck converter or boost converter, it is important that the power switches (transistors "P" and "N") open and close at the correct moment (either when the current is equal to the current limit, or equal to zero). Incorrect switch timing could cause an overshoot (voltage stress), or could cause a current flowing in parasitic diodes to flow, which might trigger a latch-up situation, or could result in a current higher than the current limit, which might be too high for the switch and/or inductor.

However the current tends to vary rapidly, in particular in view of industry trends for ever smaller inductor values: the dI/dT of the inductor current is inversely proportional to the inductor value and proportional to the voltage over the inductor. There is also a delay in the comparator itself, in the control logic and in the driver for the switch.

In order to achieve the correct switching moment, an offset can be added to the comparator threshold level. The ideal value of the comparator offset is however affected by random process mismatch, inductor value and input or output voltage variation. A comparator offset that is fixed during production will not be able to track the ideal value. Opening switches too late or too early will result in a reduced efficiency of the converter.

The comparators used in buck and boost converters can be calibrated according to the methods of the disclosure. Specifically, the calibration method (of either the offset correction or propagation delay adjustment aspects) can be applied to a zero crossing comparator and/or a current limit comparator in a buck converter or a boost converter.

FIGS. 5-8 illustrate various embodiments of the disclosure as applied to a buck converter, while FIGS. 9-12 illustrate various embodiments of the disclosure as applied to a boost converter.

Figure 5:
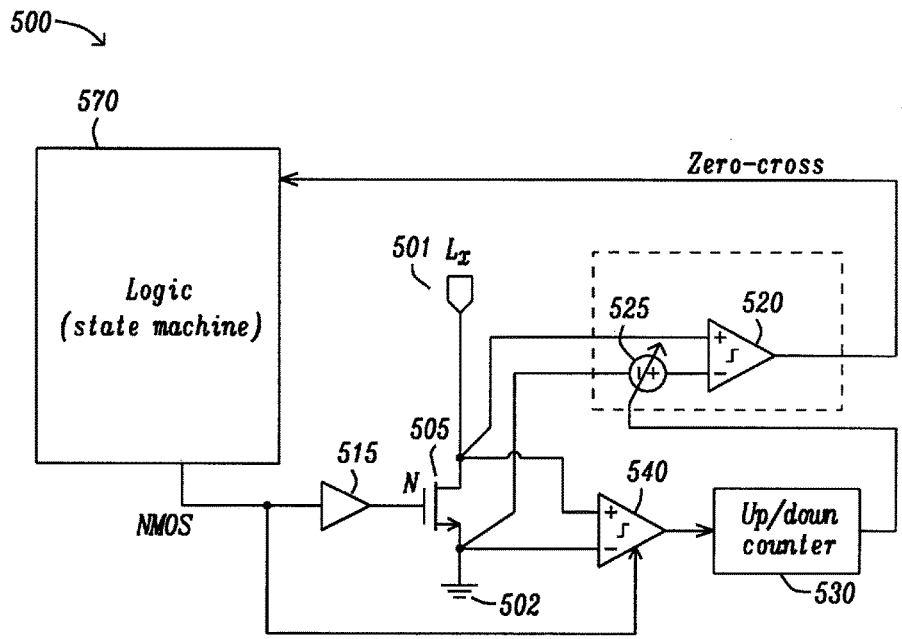
FIG. 5 illustrates a first embodiment of the disclosure, wherein a comparator calibration control in the form of an offset control is provided for a zero crossing comparator forming part of a buck converter.

FIG. 5 illustrates a first embodiment of the disclosure, wherein a comparator calibration control in the form of an offset control is provided for a zero crossing comparator forming part of a buck converter. The buck converter circuit comprises a continuous ("main") comparator monitoring the voltage over a power switch (N), a control circuit which opens the power switch based on the comparator input, and a dynamic comparator which checks if the voltage over the power switch is equal to the intended voltage at the moment of opening the power switch. The dynamic comparator should have a low offset itself which can be achieved by construction, by trimming or by calibration.

FIG. 5 illustrates a network 500 between Lx 501, and ground 502. An NMOS transistor 505 pulls down the node Lx. The NMOS transistor 505 gate electrode is connected to NMOS logic gate 515. In parallel with the NMOS 505 is a first comparator 540, and a second comparator 520. In series with second comparator 520 is a variable offset 525. The comparator 520 provides a feedback signal to controller 570. The feedback signal from comparator 520 provides a zero-cross signal. The output of comparator 540 is provided to an UP/DOWN counter 530, whose output is connected to the variable offset 525 of the comparator 520.

The offset of the main comparator 520 is controlled in small discrete steps by the digital output from the UP/DOWN counter 530. The purpose of the automatic calibration is to find the digital value for which the power switch is opened at exactly the right moment.

Each time the switch opens, the dynamic comparator generates a signal "up" or "down" for the up/down counter. This will increase or decrease the offset of the continuous comparator.

The clock for the dynamic comparator can be either the gate voltage of the switch, or can be any other logic signal that indicates that the switch will be opened shortly after (as in the figure above: the unbuffered version of the gate-voltage of the switch) or that the switch has opened very recently.

After a certain amount of clock periods, the counter value will alternate around the ideal value. The turning off of the nMOS switch "N" now happens very close to the ideal moment.

An additional advantage of continuous calibration (over one-time trimming during production) is that the offset in the main comparator will track any variation and will always make sure that the opening of switch "N" takes place very close to the ideal moment.

Figure 6:
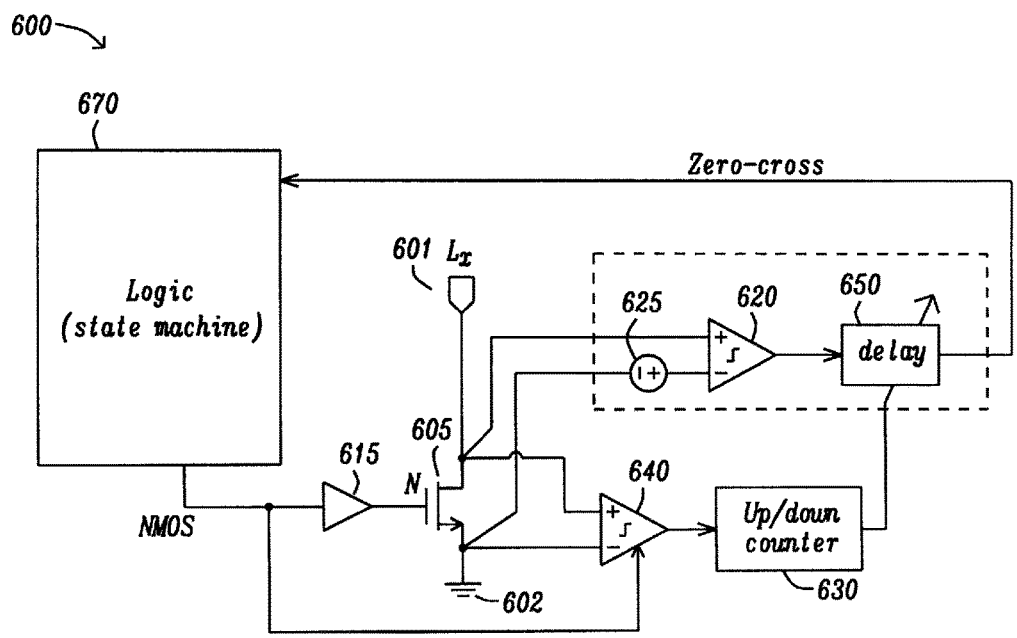
FIG. 6 illustrates a second embodiment of the disclosure, wherein a comparator calibration control in the form of a propagation delay adjustment is provided for a zero crossing comparator forming part of a buck converter.

FIG. 6 illustrates a second embodiment of the disclosure, wherein a comparator calibration control in the form of a propagation delay adjustment is provided for a zero crossing comparator forming part of a buck converter.

The components of the circuit are similar to those of FIG. 5, except that the main comparator has a fixed offset, and the up/down counter controls a delay circuit that is coupled with the output of the main comparator. The delay circuit may comprise a delay line of any suitable architecture, for example a series of buffers that can be selectively activated via a multiplexer to provide different signal delays as desired; or as an analog delay based on an RC time-constant in which either the C (capacitor) and/or the R (resistor) can be trimmed in discrete steps.

FIG. 6 illustrates a network 600 between Lx 601, and ground 602. An NMOS transistor 605 pulls down the node Lx. The NMOS transistor 605 gate electrode is connected to NMOS logic gate 615. In parallel with the NMOS 605 is a first comparator 640, and a second comparator 620. In series with second comparator 620 is a variable propagation delay 625. The comparator 620 provides a zero-cross feedback signal to logic (state machine) 670. The output of comparator 640 is provided to an UP/DOWN counter 630, whose output is connected to the variable propagation delay 650.

The offset of the main comparator is fixed and may be chosen such that when the delay circuit is set to apply a minimum propagation delay value the controller (logic/state-machine) can open the NMOS switch when the current through the switch has not yet reached zero.

The propagation delay of the main comparator is controlled in small discrete steps by the digital output from the UP/DOWN counter, and this provides an automatic calibration in a similar manner as that described above for the circuit of FIG. 3. The adjustment of the propagation delay in the main comparator will track any variation and will always make sure that opening switch "N" takes place very close to the ideal moment. For buck-converters with a programmable output voltage this is an important feature, since a changing output voltage will result in a changing ideal propagation-delay.

Again, the clock for the dynamic comparator can be either the gate voltage of the switch, or can be any other logic signal that indicates that the switch will be opened shortly after (as in the figure above: the unbuffered version of the gate-voltage of the switch) or that the switch has opened very recently.

Similar principles apply to the embodiments of the disclosure which are illustrated in FIGS. 7-12. A "main" continuous comparator is provided, which is constantly active and gives a signal to the control-logic that the switch has to be opened, and a dynamic comparator is provided which checks if the continuous comparator changed its state at the desired time.

Figure 7:
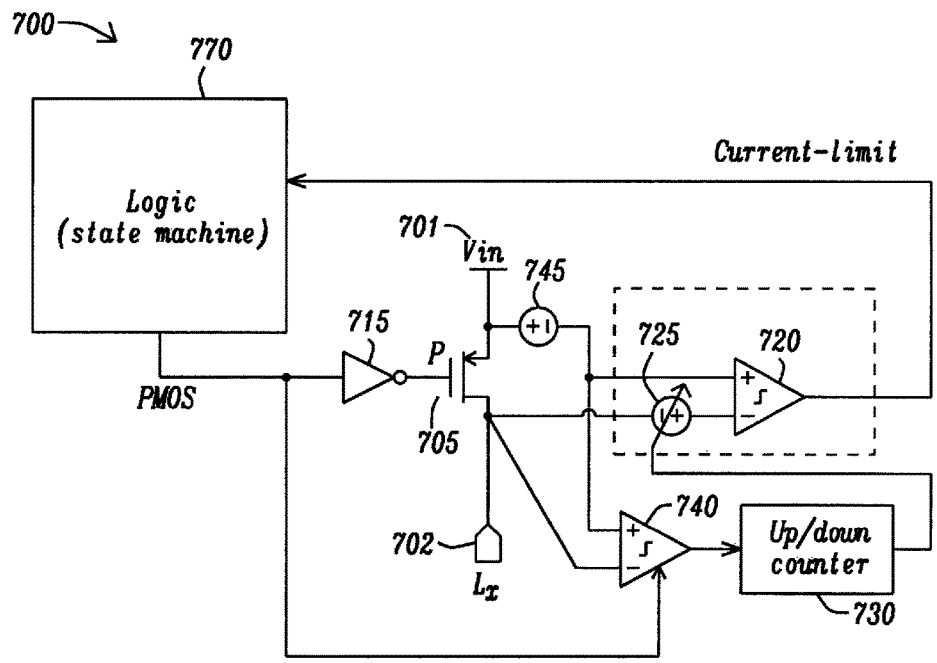
FIG. 7 illustrates a third embodiment of the disclosure, wherein a comparator calibration control in the form of an offset control is provided for a current limit comparator forming part of a buck converter.

FIG. 7 illustrates a network 700 between Vin 701, and Lx 702. A PMOS transistor 705 pulls up the node Lx. The PMOS transistor 705 gate electrode is connected to PMOS logic gate inverter 715. In parallel with the PMOS 705 is a first comparator 740, and a second comparator 720. In series with an inverting input of the second comparator 720 is a variable offset 725. In series with the non-inverting inputs of the comparators 720 and 740 is a fixed offset 745. The comparator 720 provides a current-limit feedback signal to logic (state machine) 770. The output of comparator 740 is provided to an UP/DOWN counter 730, whose output is connected to the variable offset 725.

Figure 8:
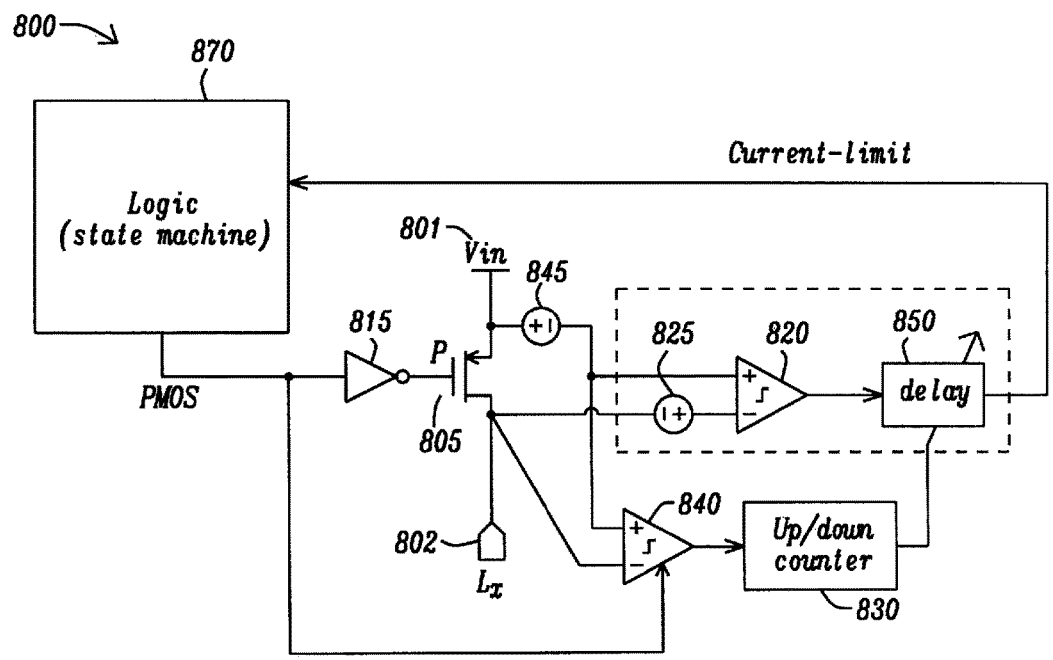
FIG. 8 illustrates a fourth embodiment of the disclosure, wherein a comparator calibration control in the form of a propagation delay adjustment is provided for a current limit comparator forming part of a buck converter.

FIG. 8 illustrates a network 800 between Vin 801, and Lx 802. A PMOS transistor 805 pulls up the node Lx. The PMOS transistor 805 gate electrode is connected to PMOS logic gate inverter 815. In parallel with the PMOS 805 is a first comparator 840, and a second comparator 820. In series with an inverting input of the second comparator 820 is a first fixed offset 825 and in series with the non-inverting inputs of the comparators 820 and 840 is second fixed offset 845. The comparator 820 provides a current-limit feedback signal to logic (state machine) 870. The output of comparator 840 is an UP/DOWN counter 830, whose output is connected to the variable propagation delay 850.

Figure 9:
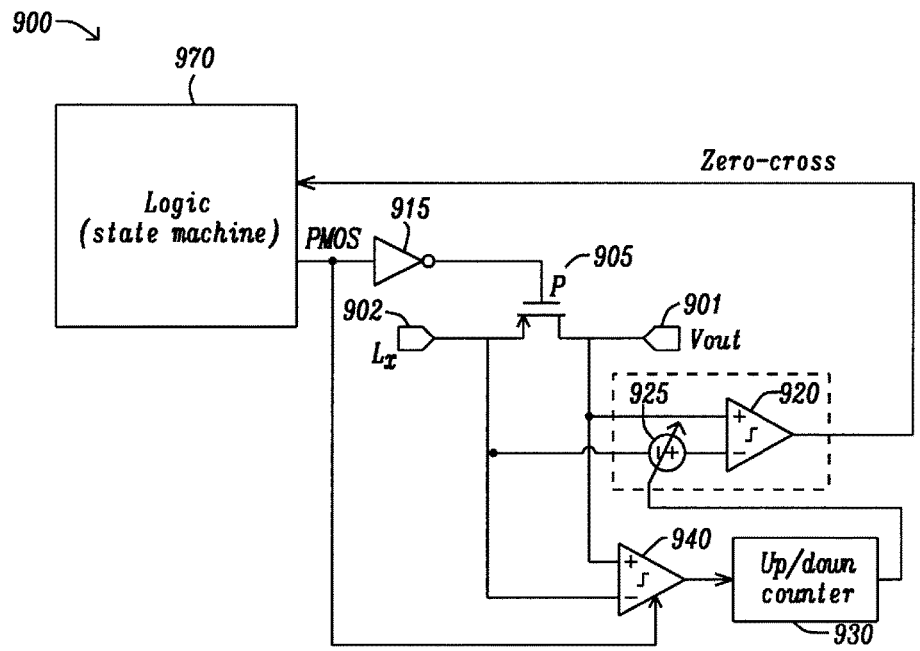
FIG. 9 illustrates a fifth embodiment of the disclosure, wherein a comparator calibration control in the form of an offset control is provided for a zero crossing comparator forming part of a boost converter.

FIG. 9 illustrates a network 900 between Vout 901, and Lx 902. An PMOS transistor 905 pulls up the node Lx. The PMOS transistor 905 gate electrode is connected to PMOS logic gate inverter 915. In parallel with the PMOS 905 is a first comparator 940, and a second comparator 920. In series with second comparator 920 is a variable offset 925. The comparator 920 provides a zero-cross feedback signal to logic (state machine) 970. The output of comparator 940 is provided to an UP/DOWN counter 930, whose output is connected to the variable offset 925.

Figure 10:
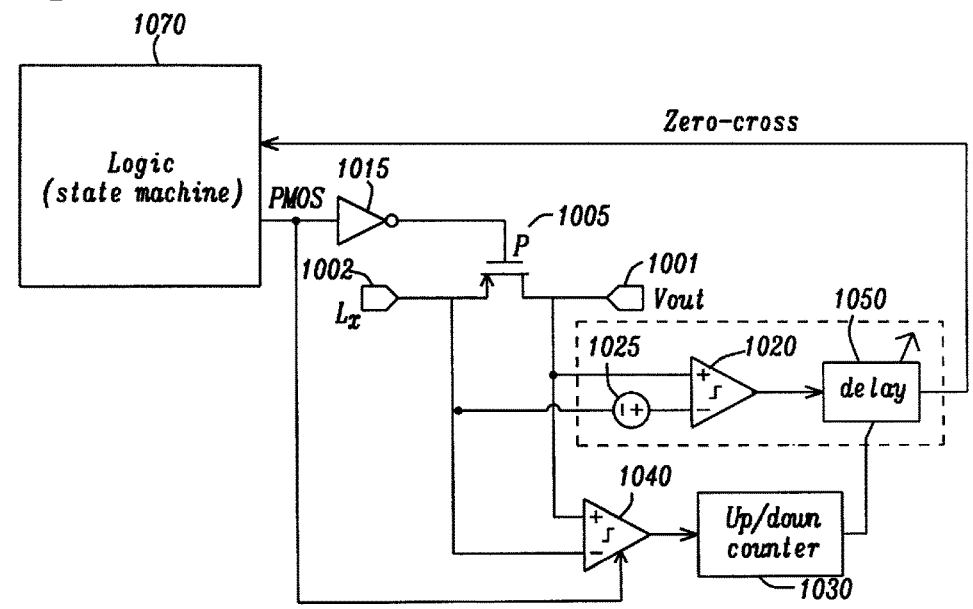
FIG. 10 illustrates a sixth embodiment of the disclosure, wherein a comparator calibration control in the form of a propagation delay adjustment is provided for a zero crossing comparator forming part of a boost converter.

FIG. 10 illustrates a network 1000 between Vout 1001, and Lx 1002. An PMOS transistor 1005 pulls up the node Lx. The PMOS transistor 1005 gate electrode is connected to PMOS logic gate inverter 1015. In parallel with the PMOS 1005 is a first comparator 1040, and a second comparator 1020. In series with second comparator 1020 is a fixed offset 1025. The output of comparator 1040 is provided to an UP/DOWN counter 1030, whose output is connected to a variable propagation delay 1050. The variable propagation delay 1050 provides a zero-cross feedback signal to logic (state machine) 1070.

Figure 11:
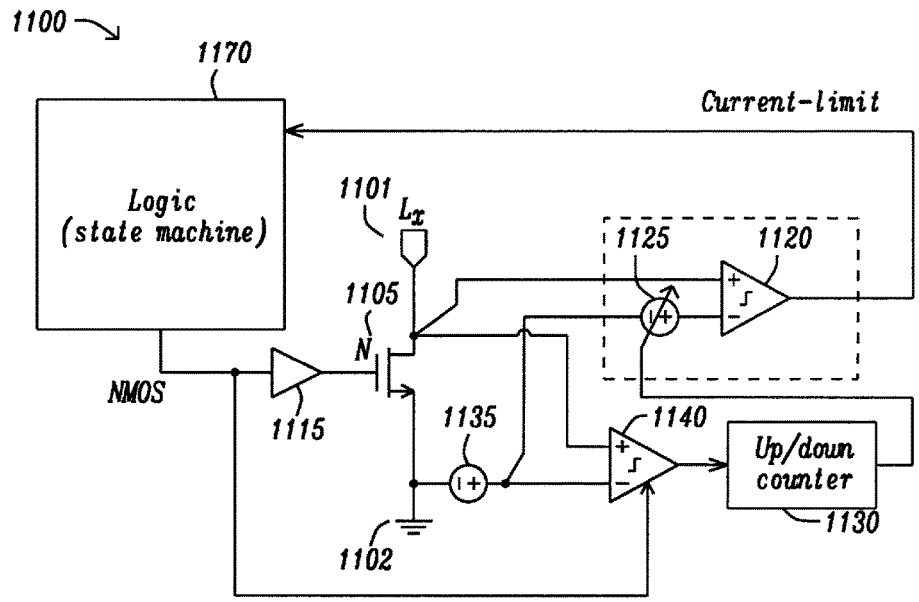
FIG. 11 illustrates a seventh embodiment of the disclosure, wherein a comparator calibration control in the form of an offset control is provided for a current limit comparator forming part of a boost converter.

FIG. 11 illustrates a network 1100 between Lx 1101, and ground 1102. An NMOS transistor 1105 pulls down the node Lx. The NMOS transistor 1105 gate electrode is connected to NMOS logic gate 1115. In parallel with the NMOS 1105 is a first comparator 1140, and a second comparator 1120. In series with second comparator 1120 is a variable offset 1125 and a fixed offset 1135. The output of comparator 1140 is provided to an UP/DOWN counter 1130, whose output is connected to the variable offset 1125. The variable offset 1125 provides a signal to comparator 1120 whose current-limit feedback signal to logic (state machine) 1170.

Figure 12:
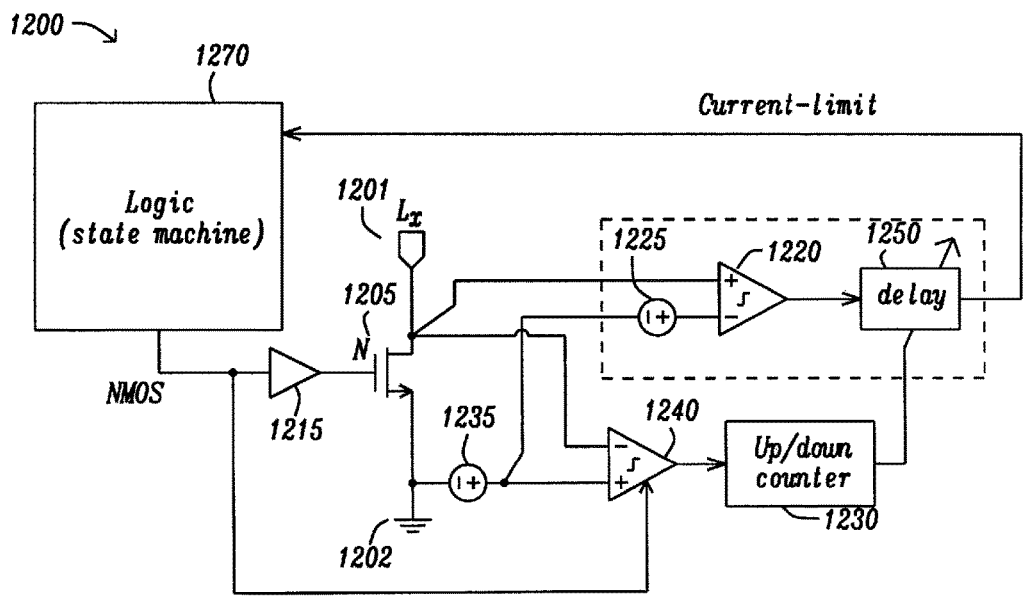
FIG. 12 illustrates an eighth embodiment of the disclosure, wherein a comparator calibration control in the form of a propagation delay adjustment is provided for a current limit comparator forming part of a boost converter.

FIG. 12 illustrates a network 1200 between Lx 1201, and ground 1202. An NMOS transistor 1205 pulls down the node Lx. The NMOS transistor 1205 gate electrode is connected to NMOS logic gate 1215. In parallel with the NMOS 1205 is a first comparator 1240, and a second comparator 1220. In series with second comparator 1220 are two fixed offsets 1225 and 1235. The output of comparator 1240 is provided to an UP/DOWN counter 1230, whose output is connected to a variable propagation delay 1250. The variable propagation delay 1250 provides a current limit feedback signal to logic (state machine) 1270.

Figure 13:
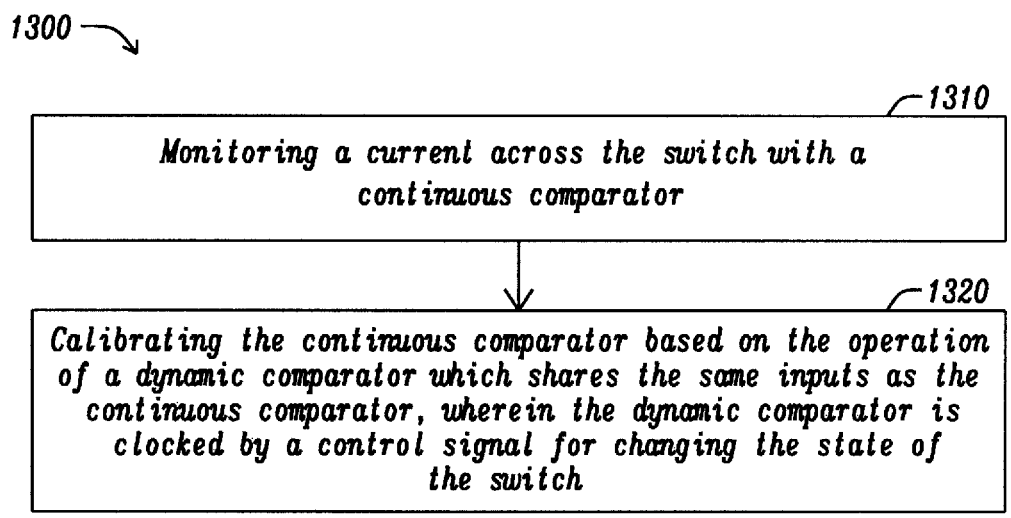
FIG. 13 illustrates a method of an embodiment in accordance with the disclosure.

FIG. 13 illustrates a method in accordance with an embodiment in the disclosure. A method 1300 of operating a switch in a circuit, comprising of the following: a first step 1310 monitoring a current across the switch with a continuous comparator, and a second step 1320 calibrating the continuous comparator based on the operation of a dynamic comparator which shares the same inputs as the continuous comparator, wherein the dynamic comparator is clocked by a control signal for changing the state of the switch.

The methods and apparatus of the disclosure therefore provides for accurate current limit and zero-current switching. When the disclosure is implemented, the circuit will not need to be trimmed during production, as the circuit can track changing situations such as changing output or input voltages.

Various modifications and improvements can be made to the above without departing from the scope of the disclosure.

For example, the figures showing the buck and boost converters generally assume that they operate in discontinuous conduction mode. However the disclosure also applies to a continuous mode of operation, including for detecting when a continuous mode has to be changed to a discontinuous mode.

It is also to be appreciated that the conductivity types of specific embodiments may generally be reversed. In particular, switches which are drawn as pMOS transistors with an inverter in the diagrams may be alternatively implemented as nMOS transistors with a buffer; and vice versa.

What is claimed is:

1. A circuit comprising:
   a power switch;
   a logic circuit adapted to provide a control signal for changing a state of the power switch;
   a continuous comparator that monitors a current across the power switch;
   a dynamic comparator comprising a latch and which shares the same inputs as the continuous comparator; the dynamic comparator being adapted to provide a logic signal;
   a calibration control adapted to calibrate the continuous comparator;
   wherein the latch of the dynamic comparator is adapted to receive the control signal; and
   wherein the calibration control comprises a counter coupled with an output of the dynamic comparator and a variable propagation delay that is directly connected to the continuous comparator;
   the counter being adapted to receive the logic signal; wherein the counter operates to increment or decrement the variable propagation delay;
   wherein the continuous comparator has a fixed offset, the fixed offset being such that when the variable propagation delay is set to zero, the logic circuit opens the power switch while the current across the power switch is decreasing but before the current reaches zero.

2. The circuit of claim 1, wherein the continuous comparator is a zero crossing comparator.

3. The circuit of claim 1, wherein the continuous comparator is a current limit comparator.

4. A switched mode power supply including a circuit that comprises:
  a power switch;
  a logic circuit adapted to provide a control signal for changing a state of the power switch;
  a continuous comparator that monitors a current across the power switch;
  a dynamic comparator comprising a latch and which shares the same inputs as the continuous comparator; the dynamic comparator being adapted to provide a logic signal;
  a calibration control adapted to calibrate the continuous comparator;
  wherein the latch of the dynamic comparator is adapted to receive the control signal; and
  wherein the calibration control comprises a counter coupled with an output of the dynamic comparator and a variable propagation delay that is directly connected to the continuous comparator;
  the counter being adapted to receive the logic signal;
  wherein the counter operates to increment or decrement the variable propagation delay;
  wherein the continuous comparator has a fixed offset, the fixed offset being such that when the variable propagation delay is set to zero, the logic circuit opens the power switch while the current across the power switch is decreasing but before the current reaches zero.

5. The switched mode power supply of claim 4, wherein the continuous comparator is a zero crossing comparator.

6. The switched mode power supply of claim 4, wherein the continuous comparator is a current limit comparator.

7. A method of operating a power switch in a circuit, comprising:
  providing a control signal for changing a state of the power switch;
  monitoring a current across the power switch with a continuous comparator;
  providing a dynamic comparator to generate a logic signal, wherein the dynamic comparator comprises a latch and shares the same inputs as the continuous comparator;
  wherein the latch of the dynamic comparator receives the control signal for changing the state of the power switch;
  providing a calibration control for calibrating the continuous comparator, the calibration control comprising a counter directly connected to an output of the dynamic comparator, and a variable propagation delay connected to the continuous comparator; and
  calibrating the continuous comparator using the counter by receiving the logic signal to increment or decrement the counter, which in turn adjust the variable propagation delay;
  wherein the continuous comparator has a fixed offset, the fixed offset being such that when the variable propagation delay is set to zero, the control signal opens the power switch while the current across the power switch is decreasing but before the current reaches reached zero.

8. The method of claim 7, wherein the continuous comparator is a zero crossing comparator or a current limit comparator.

9. The method of claim 7, wherein the circuit comprises a switched mode power supply.

10. The method of claim 9, wherein the switched mode power supply comprises a buck converter, boost converter, or a buck-boost converter and wherein one or more continuous comparators are provided, comprising a zero crossing comparator and/or a current limit comparator.

\* \* \* \* \*

UNITED STATES PATENT AND TRADEMARK OFFICE
CERTIFICATE OF CORRECTION

PATENT NO.        : 10,554,126 B2
APPLICATION NO.   : 14/513326
DATED             : February 4, 2020
INVENTOR(S)       : Marinus Wilhelmus Kruiskamp and Guillaume de Cremoux It is certified that error appears in the above-identified patent and that said Letters Patent is hereby corrected as shown below:

In the Claims

In Columns 11, Lines 32-33, cancel the text beginning with:
"7. A method of operating a power switch in a circuit, comprising:" to and ending "is decreasing but before the current reaches reached zero." in Column 12, Lines 23-24 and insert the following claim:
--7. A method of operating a power switch in a circuit, comprising:
providing a control signal for changing a state of the power switch;
monitoring a current across the power switch with a continuous comparator;
providing a dynamic comparator to generate a logic signal, wherein the dynamic comparator comprises a latch and shares the same inputs as the continuous comparator;
wherein the latch of the dynamic comparator receives the control signal for changing the state of the power switch;
providing a calibration control for calibrating the continuous comparator, the calibration control comprising a counter directly connected to an output of the dynamic comparator, and a variable propagation delay connected to the continuous comparator; and
calibrating the continuous comparator using the counter by receiving the logic signal to increment or decrement the counter, which in turn adjust the variable propagation delay;
wherein the continuous comparator has a fixed offset, the fixed offset being such that when the variable propa- Signed and Sealed this
Sixth Day of December, 2022

*Katherine Kelly Vidal*
Katherine Kelly Vidal
*Director of the United States Patent and Trademark Office*

CERTIFICATE OF CORRECTION (continued)
U.S. Pat. No. 10,554,126 B2 gation delay is set to zero, the control signal opens the power switch while the current across the power switch is decreasing but before the current reaches zero.--